United States Patent [19]

Bell

[11] Patent Number: 5,003,198

[45] Date of Patent: Mar. 26, 1991

[54] CIRCUIT TECHNIQUE FOR BIASING COMPLEMENTARY DARLINGTON EMITTER FOLLOWER STAGES

[75] Inventor: Kenneth M. Bell, Windom, Tex.

[73] Assignee: Texas Instruments Incorporated, Dallas, Tex.

[21] Appl. No.: 414,048

[22] Filed: Sep. 28, 1989

[51] Int. Cl.[5] .................... H03K 3/013; H03K 17/60; H03F 3/04; G05F 3/16
[52] U.S. Cl. .................................. 307/315; 307/313; 307/310; 323/315
[58] Field of Search ............ 307/315, 313, 310, 296.1; 330/288, 267, 268; 323/315; 357/46

[56] References Cited

U.S. PATENT DOCUMENTS 4,945,259  7/1990  Anderson ........................ 307/296.1

OTHER PUBLICATIONS

Al Pshaenich, "Driving Inductive Loads", Electronic Design 4, pp. 86–91, Feb. 15, 1977.
IEEE Journal of Solid-State Circuits-A Monolithic Power Op Amp-by Robert J. Widlar and Mineo Yamatake-Apr., 1988-9 pages.
IEEE Journal of Solid-State Circuits, vol. 23, No. 3, Jun. 1988-A Low-Distortion Output Stage with Improved Stability for Monolithic Power Amplifiers by Evert Seevinck, Wim DeJafer, and Piet Buttendijk.

Primary Examiner—Stanley D. Miller
Assistant Examiner—Nam T. Nguyen
Attorney, Agent, or Firm—B. Peter Barndt; James T. Comfort; Melvin Sharp

[57] ABSTRACT

A circuit technique for biasing a complementary NPN-PNP Darlington Emitter Follower Stage without additional biasing resistors or current sources. Four diode-connected transistor are connected in series to provide biasing across the Darlington. Two transistors, one NPN and one PNP, are added with their bases and emitters connected in parallel with the top and bottom diodes, respectively, forming two current mirrors. The collector of the NPN transistor connects to the emitter of the first Darlington NPN transistor. The collector of the PNP transistor connects to the first Darlington PNP transistor. The current mirrors provide equal current to the two first Darlington transistors. These currents are also equal to the current through the four diodes for identically sized transistors.

19 Claims, 2 Drawing Sheets

CIRCUIT TECHNIQUE FOR BIASING COMPLEMENTARY DARLINGTON EMITTER FOLLOWER STAGES

FIELD OF THE INVENTION

This invention relates to a circuit technique for biasing complementary NPN-PNP Darlington emitter follower stages.

BACKGROUND OF THE INVENTION

Previous methods for biasing complementary Darlington stages incorporated either resistors or extra constant current sources to provide operating currents for the Darlington transistors. Two common methods are resistor biasing, shown in FIGS. 1 and 2, and constant current source biasing, shown in FIG. 3.

One method of accomplishing resistor biasing is shown in FIG. 1. A resistor R1 is connected between the emitters of the first Darlington transistors QN4 and QP4. Since the Vbe's of the two output Darlington transistors QN5 and QP5 will appear across resistor R1, resistor R1 must be made large for low current operation, since the voltage drop is approximately 1.4 volts at 27° C. The value for resistor R1 would typically be approximately 140K ohms for 10 microamps of current through transistors QN4 and QP4.

Resistors of that size require large areas of silicon to implement. Since most diffused or implanted resistors have positive temperature coefficients while those of the Vbe's of bipolar transistors are negative, large variations in the biasing current of the first Darlington transistors QN4 and QP4 will occur over temperature. Variations in the sheet resistance value of the process will also cause variations in the biasing current.

A second method of resistor biasing is illustrated in FIG. 2. Resistors R1 and R2 are connected across the base and emitters of Darlington transistors QN5 and QP5, respectively. In this case, the Vbe of QN5 will appear across resistor R1, while the Vbe of QP5 will appear across resistor R2. Since the Vbe of transistors QN5 and QP5 are approximately 0.7 volts at 27° C., resistors R1 and R2 will have to be made large for low current operations. The typical value for resistors R1 and R2 would be approximately 70K ohms for 10 microamps of current through QN4 and QP4. Again, resistors of this size would require large areas of silicon to implement. Furthermore, since most diffused or implanted resistors have positive temperature coefficients while those of the Vbe's of bipolar transistors are negative, large variations will again occur in the biasing current of the first Darlington transistors QN4 and QP4 with variations in temperature. Variations in the sheet resistance value of the process also cause variations in the biasing current.

Another method of biasing is shown in FIG. 3. As shown in FIG. 3, two constant current sources I1 and I2 are used to bias the first Darlington transistors QN4' and QP4' respectively. This method of biasing requires one current source connected to each supply rail. Although the current supplied by current sources I1 and I2 will remain more constant than that provided by the resistor bias described above, the tracking of these currents to the main bias current in the output stage (I) with variations in supply voltage and temperature must also be considered. The current sources I1 and I2 will need to have cascoded outputs to minimize the current variation with output voltage swing if the early voltage of the current source transistors is low. Since one reference current generator is usually used to establish bias current for the Darlington stage, a current mirror connected to the other supply rail will have to be added to generate the opposite polarity current for the complementary first Darlington device. Additional mismatch among the various components must also be taken into account in the design.

SUMMARY OF THE INVENTION

In accordance with the present invention, the problems relating to using large areas of silicon to implement resistor biasing and problems relating to variations in current with temperature both in the case of resistor biasing and in the case of current source biasing have been minimized. The present invention provides a technique for biasing complementary Darlington stages which minimizes the areas of silicon required to implement, and which minimizes variations in bias current because of temperature variations.

A method of biasing complementary bipolar Darlington emitter follower stages is disclosed, comprising the steps of:

coupling a first current mirror to one of the Darlington stages;

supplying current to the first current mirror;

coupling a second current mirror to the other one of the Darlington stages;

coupling a constant current active load to the second current mirror; and coupling the first and second current mirrors together.

The step of coupling first and second current mirrors together includes coupling a pair of complementary diode connected bipolar transistors between the first and second current mirrors.

The method also includes coupling the first and second Darlington stages to first and second supply voltage sources, respectively.

The drive circuit for complementary Darlington emitter follower stages comprises:

a first current mirror coupled to one of said stages;

a first active device coupled to and providing current to the first current mirror;

a second current mirror coupled to the other one of the stages;

a second active device coupled to and providing current to the second current source; and a bias circuit coupled between the first and second current sources.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE PREFERRED EMBODIMENT

Figure 2:
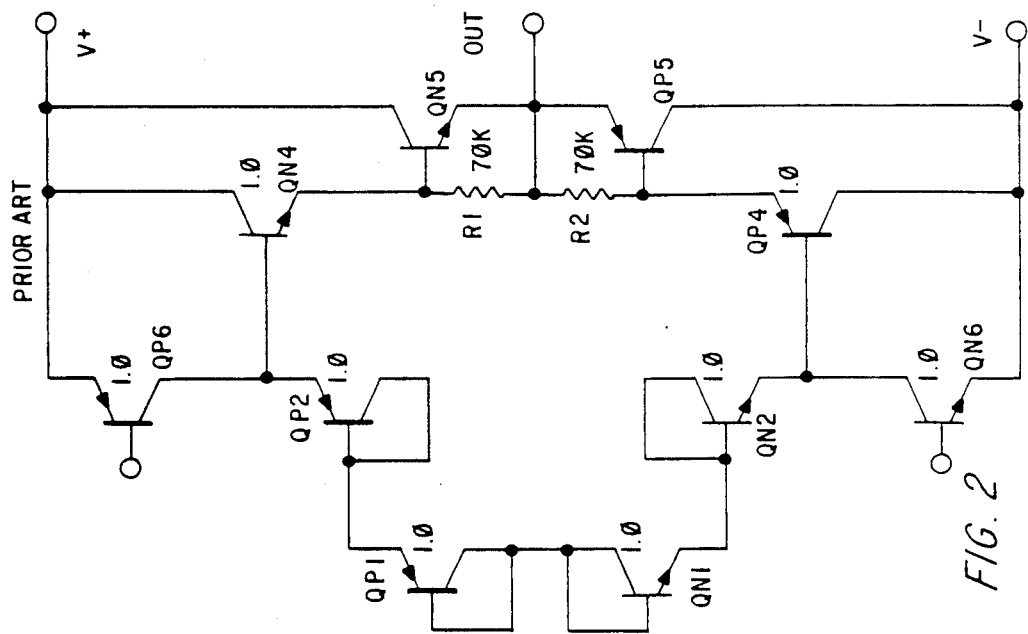
FIG. 2 illustrates a second prior art method of biasing complementary Darlington stages.
Figure 1:
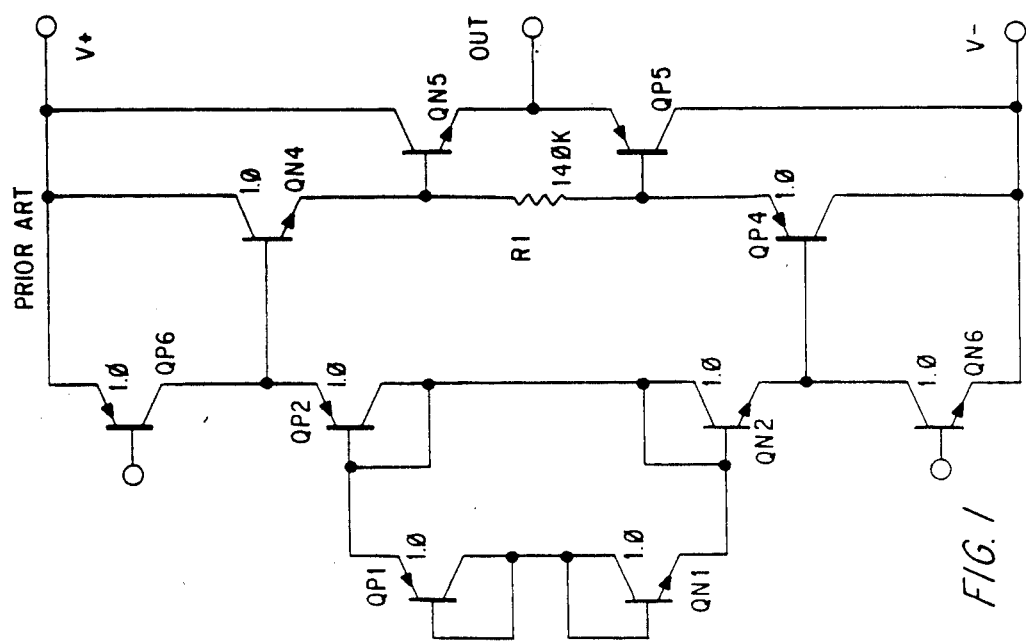
FIG. 1 illustrates a prior art method of biasing complementary Darlington stages.
Figure 4:
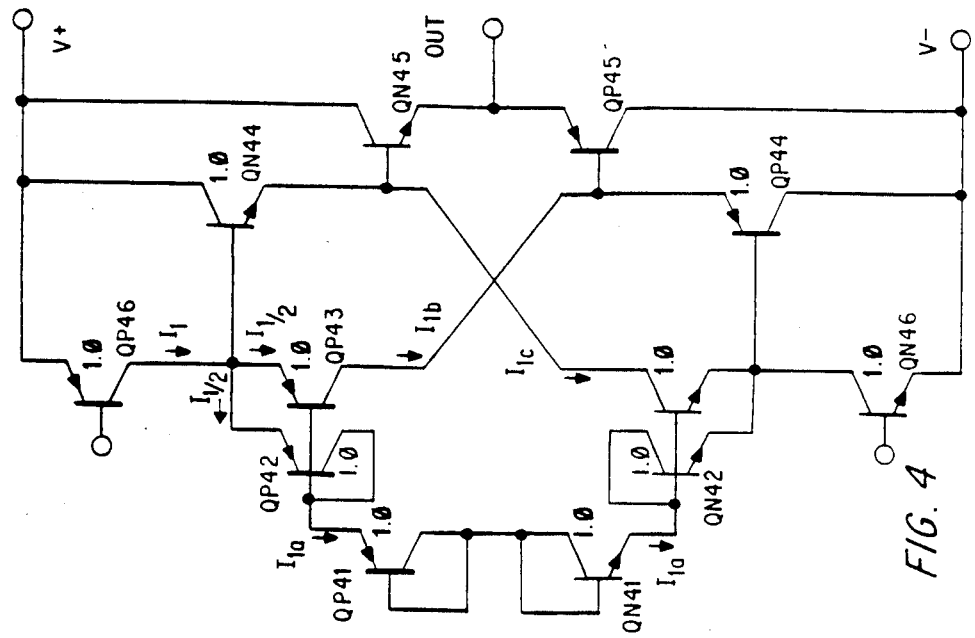
FIG. 4 illustrates the present invention.
Figure 3:
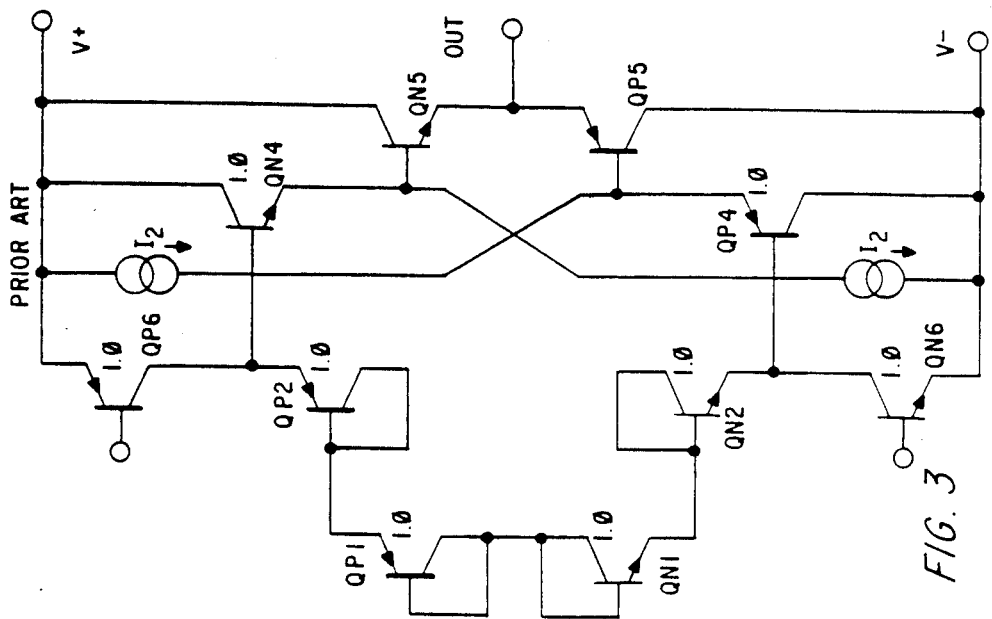
FIG. 3 illustrates a third prior art method of biasing Darlington stages utilizing current sources.

Referring to FIG. 4, there is shown a drive circuit for complementary NPN-PNP Darlington stages. The circuit depicted therein is preferred because it provides a drive circuit which requires little area of silicon to implement, and it minimizes problems associated with bias currents varying with temperature and resistor value changes.

The circuit as shown in FIG. 4 includes a first pair of Darlington transistors, QN44 and QN45. The collectors of QN44 and QN45 are connected to a positive voltage supply labeled V+. The emitter of QN44 is connected to the base of QN45. The emitter of QN45 is connected to an output node, labeled OUT. In the preferred embodiment, transistors QN44 and QN45 are both NPN transistors.

As shown in FIG. 4, there is also a second Darlington pair, including transistors QP44 and QP45. The collectors of transistors QP44 and QP45 are connected to a negative voltage supply labeled V−. The emitter of transistor QP44 is coupled to the base of transistor QP45. The emitter of transistor QP45 is coupled to the emitter of transistor QN45 and to the output node OUT.

The circuit also has a PNP bipolar transistor QP46. The emitter of transistor QP46 is connected to the positive voltage supply. The collector of transistor QP46 is coupled to the base of transistor QN44, as well as to the emitters of a pair of bipolar transistors QP42 and QP43.

Transistors QP42 and QP43 are connected as a current mirror, with their bases connected. The collector of transistor QP43 is coupled to the base of transistor QP45 and to the emitter of transistor QP44. The collector of transistor QP42 is coupled to its base.

The emitter of a PNP transistor QP41 is coupled to the bases of transistors QP42 and QP43. The base and collector of transistor QP41 are coupled together, as well as to the collector and base of a complementary NPN transistor QN41. The emitter of transistor QN41 is coupled to the bases of NPN transistor QN42 and QN43, which are connected as a current mirror. The collector of transistor QN42 is coupled to its base. The collector of transistor QN43 is coupled to the base of transistor QN45 and to the emitter of transistor QN44. The emitters of transistors QN42 and QN43 are coupled together, as well as to the base of transistor QP44.

An NPN transistor QN46 has its collector coupled to the emitters of QN42 and QN43, and to the base of transistor QP44. The emitter of transistor QN46 is connected to a source of negative voltage.

In operation, neglecting base currents, current $I_1$ enters through the collector of transistor QP46. Since transistors QP42 and QP43 are connected as a current mirror, if the emitter areas of both transistors QP42 and QP43 are equal, the current $I_1$ will be split in half. Current $I_1a$ through transistor QP42 will also pass through the diode connected transistors QP41, QN41, and QP42. Current $I_1b$ passing through QP43 is used to bias QP44. QP44 is biased without the need for a biasing resistor and an external current source.

Current $I_1a$ through QN42 establishes a similar current $I_1c$ in transistor QN43, provided that QN42 and QN43 have the same emitter areas. Current $I_1c$ is used to bias QN44, in the same manner that current $I_1b$ biases transistor QP44.

Since the collector-emitter voltages across QN43 and QP43 remain almost constant with output voltage swing, early voltage modulation of the current through these transistors is minimal.

If the emitter areas of QN44 and QP44 are equal, respectively, to the emitter areas of QN42 and QN43 and the emitter areas of QP42 and QP43, then the voltage between the emitters of QN44 and QP44 will be equal to the voltage across QN41 and QP41. By scaling the respective emitter areas of the output transistors QN45 and QP45 with respect to QN41 and QP41, the class AB output current will be scaled accordingly (neglecting early voltage effects).

Since only Vbe drops are involved and no resistors are used, the class AB bias current will remain very constant over temperature with respect to current $I_1$, the bias current.

As has been shown above, the circuit provides a method of biasing complementary bipolar Darlington emitter follower stages without the use of large valued resistors or extra constant current sources. This technique is particularly well suited for integrated circuit designs, since it reduces the total area required for the cell and relies on the close component matching inherent in the integrated circuit process. Since the biasing is derived from Vbe ratios, it remains a constant multiple of the previous stage bias current. No additional current sources are needed to bias the first Darlington output transistors QN44 and QP44. The circuit may be driven from either a common emitter NPN or PNP amplifier stage with a constant current PNP or NPN active load, respectively (NPN driver QN46 with QP46 current source and vice versa).

I claim:

1. A method of biasing complementary bipolar Darlington emitter follower stages, comprising the steps of:
   coupling a first current mirror to one of the Darlington stages;
   supplying current to the first current mirror;
   coupling a second current mirror to the other one of the Darlington stages;
   coupling a constant current active load to the second current mirror; and
   coupling the first current mirror to the second current mirror.

2. The method of claim 1, wherein the step of coupling the first current mirror to the second current mirror further comprises the step of:
   coupling a complementary pair of diode connected bipolar transistors between the first and second current mirrors.

3. The method of claim 1, further comprising the step of:
   coupling the first and second Darlington stages to first and second supply voltage sources, respectively.

4. A circuit for biasing complementary bipolar Darlington emitter follower stages, comprising:
   a first current mirror coupled to one of the Darlington stages;
   a first active device coupled to and providing current to the first current mirror;
   a second current mirror coupled to the other one of the Darlington stages;
   a second active device coupled to and providing current to the second current mirror;
   a bias circuit coupled between the first and second current mirrors.

5. The circuit of claim 4, wherein the bias circuit comprises a complementary pair of diode connected bipolar transistors.

6. The circuit of claim 4, wherein one of the Darlington stages is coupled to a positive voltage supply and the other one of the Darlington stages is coupled to a negative voltage supply.

7. A circuit for biasing complementary bipolar Darlington emitter follower stages, comprising:
- a first Darlington pair coupled between a supply voltage and an output node;
- a second Darlington pair coupled between a second supply voltage and the output node;
- a first current mirror coupled to the first Darlington pair;
- a second current mirror coupled to the second Darlington pair;
- a second active device coupled to and providing current to the second current mirror;
- a first active device coupled to and providing current to the first current mirror; and
- a bias circuit coupled between the first and second current mirrors.

8. The circuit of claim 7, wherein the bias circuit comprises a complementary pair of diode connected bipolar transistors.

9. The circuit of claim 7, wherein the first current mirror comprises a pair of PNP bipolar transistors.

10. The circuit of claim 7, wherein the second current mirror comprises a pair of NPN bipolar transistors.

11. The circuit of claim 7, wherein the first active device is coupled to a first signal input and the second active device is coupled to a second signal input.

12. A circuit for biasing complementary bipolar Darlington emitter follower stages comprising:
- a first Darlington pair of transistors having their collectors coupled to a positive voltage supply, the emitter of a first one of the pair being coupled to an output node;
- a second Darlington pair of transistors having their collectors coupled to a negative voltage supply, the emitter of a first one of the second Darlington pair being coupled to the emitter of the first one of the first Darlington pair;
- a first current operatively mirror coupled to the first Darlington pair;
- a first active device coupled to and providing current to the first current mirror;
- a second current mirror operatively coupled to the second Darlington pair;
- a second active device coupled to and providing current to the second current mirror; and
- a bias circuit coupled between the first and second current mirrors.

13. The circuit of claim 12, wherein the bias circuit comprises:
- a complementary pair of diode connected bipolar transistors coupled in series between the first and second current mirrors.

14. The circuit of claim 12, wherein the second active device further comprises:
- a bipolar transistor having its emitter coupled to the positive voltage supply, its collector coupled to the second current mirror and the base of the second one of the first Darlington pair, and its base connected to a bias source.

15. The circuit of claim 11, wherein the first active device further comprises:
- a bipolar transistor having its emitter coupled to the negative voltage supply, its collector coupled to the first current mirror and the base of the second one of the second Darlington pair, and its base connected to a signal input.

16. The circuit of claim 11, wherein the first Darlington stage comprises a pair of NPN Bipolar transistors, with the emitter of the second one of the pair being coupled to the base of the first one of the pair and the first current source.

17. The circuit of claim 11, wherein the second Darlington pair comprises a pair of PNP Bipolar transistors with the emitter of the second one of the pair being coupled to the base of the first one of the pair and to the second current mirror.

18. The circuit of claim 12, wherein the second active device further comprises:
- a bipolar transistor having its emitter coupled to the positive voltage supply, its collector coupled to the second current mirror and the base of the second one of the first Darlington pair, and its base connected to a signal input.

19. The circuit of claim 11, wherein the first active device further comprises:
- a bipolar transistor having its emitter coupled to the negative voltage supply, its collector coupled to the first current mirror and the base of the second one of the second Darlington pair, and its base connected to a bias source.

* * * * *